United States Patent
Nakamura et al.

(10) Patent No.: US 6,692,794 B2
(45) Date of Patent: Feb. 17, 2004

(54) COMPOSITE AND MANUFACTURING METHOD THEREFOR

(75) Inventors: Masatoshi Nakamura, Hamamatsu (JP); Yoshinori Hatanaka, Hamamatsu (JP)

(73) Assignee: Murakami Corporation, Shizuoka (JP)

( * ) Notice: Subject to any disclaimer, the term of this patent is extended or adjusted under 35 U.S.C. 154(b) by 0 days.

(21) Appl. No.: 10/217,113

(22) Filed: Aug. 12, 2002

(65) Prior Publication Data

US 2002/0192395 A1 Dec. 19, 2002

Related U.S. Application Data

(62) Division of application No. 09/940,409, filed on Aug. 27, 2001, now Pat. No. 6,472,088.

(30) Foreign Application Priority Data

Oct. 3, 2000 (JP) ......................................... 2000-303051

(51) Int. Cl.[7] .................... H05H 1/24; C23C 16/40; C23C 16/18; C23C 16/50; B32B 18/00
(52) U.S. Cl. .................... 427/576; 427/564; 428/702
(58) Field of Search .................... 428/411.1, 912.2, 428/426, 432, 702, 688, 689; 427/576, 569, 564, 562

(56) References Cited

U.S. PATENT DOCUMENTS

| | | | | |
|---|---|---|---|---|
| 3,655,438 A | * | 4/1972 | Sterling et al. | |
| 4,927,704 A | * | 5/1990 | Reed et al. | |
| 5,017,404 A | * | 5/1991 | Paquet et al. | |
| 5,156,882 A | * | 10/1992 | Rzad et al. | 427/569 |
| 5,686,151 A | * | 11/1997 | Imai et al. | 427/576 |
| 5,891,349 A | * | 4/1999 | Tobe et al. | 427/596 |
| 6,013,372 A | * | 1/2000 | Hayakawa et al. | 428/411.1 |
| 6,200,893 B1 | * | 3/2001 | Sneh | 427/576 |
| 6,426,125 B1 | * | 7/2002 | Yang et al. | 427/576 |

FOREIGN PATENT DOCUMENTS

| | | | |
|---|---|---|---|
| JP | 60-186418 | 9/1985 | |
| JP | 3-111574 | 5/1991 | |
| JP | 10-036144 | 2/1998 | |
| JP | 10237353 A | * 9/1998 | C09D/1/00 |
| JP | 11-323194 | 11/1999 | |
| JP | 2000-001668 A | * 1/2000 | C09K/3/18 |
| JP | 2000-336196 | 12/2000 | |

* cited by examiner

Primary Examiner—Marianne Padgett
(74) Attorney, Agent, or Firm—Hedman & Costigan, P.C.

(57) ABSTRACT

This invention provides a composite having a hydrophilic film made of amorphous titanium oxide. A film is deposited on a substrate made of, for example, glass or synthetic resin. The film is composed of amorphous titanium oxide partially having structures in which a network of Ti—O—Ti bond is broken to give Ti—OH bond terminals.

5 Claims, 8 Drawing Sheets

COMPOSITE AND MANUFACTURING METHOD THEREFOR

This application is a divisional of application Ser. No. 09/940,409, filed on Aug. 27, 2001, now U.S. Pat. No. 6,472,088B 2, issued Oct. 29, 2002.

BACKGROUND OF THE INVENTION

1. Field of the Invention

This invention relates to a composite in which a film mainly comprising amorphous titanium oxide is formed on a surface of a base and to a manufacturing method therefor.

2. Description of the Prior Art

It has been known that a base surface is coated with titanium oxide and photoexcited to make the surface hydrophilic. In the prior art, among titanium oxides, only anatase-type titanium dioxide has been made adequately hydrophilic by photoexcitation.

BRIEF SUMMARY OF THE INVENTION

Object of the Invention

Formation of anatase-type titanium dioxide films requires a high temperature process, which has made it difficult to apply such a film to a base comprising a low melting temperature material such as synthetic resin. For the base made of soda-glass, a high temperature process causes diffusion of sodium in the soda glass into the titanium dioxide film, leading to deteriorated performance (reduction in photoexcitation efficiency). For preventing performance deterioration, it is necessary to form a passivation layer between the soda-glass base and the titanium dioxide film, leading to a more complicated manufacturing method.

In view of these problems, an objective of this invention is to provide a composite in which a novel amorphous titanium oxide film is deposited on a base surface for hydrophilicity and a manufacturing method therefor.

SUMMARY OF THE INVENTION

This invention provides a composite comprising a base and a film mainly formed of amorphous titanium oxide on the base, wherein the amorphous titanium oxide partially has a structure in which a network of Ti—O—Ti bond is broken to give Ti—OH bond terminals. In general, it is known that amorphous titanium oxide films have photoexcitation efficiency too low to give adequate hydrophilicity. In contrast, our experiments showed that more hydrophilicity could be achieved by photoexcitation using the amorphous titanium oxide film of this invention partially comprising a structure in which a network of Ti—O—Ti bond is broken to give Ti—OH bond terminals. It may be because in a common amorphous titanium oxide film, electrons and holes generated by photoexcitation might have a high probability of being recombined due to, for example, the presence of dangling bonds in the film, leading to reduced photoexcitation efficiency, while in a titanium oxide film according to this invention, dangling bonds in the film might be bound to OH groups to reduce the number of dangling bonds so that recombination of electrons and holes generated by photoexcitation might be inhibited and, furthermore, electron-releasing property of an OH group itself might contribute to improvement in hydrophilicity.

In amorphous titanium oxide in this invention, a proportion may widely vary for Ti—OH terminals generated by bond cleavage in Ti—O bonds in a Ti—O—Ti bond network. If the proportion is less than 5%, hydrophilicity will become too low while if the proportion is more than 30%, film strength will be reduced. Thus, the most suitable proportion is about 5 to 30%. A base may be made of, for example, glass or synthetic resin. When a base is used as a mirror such as an exterior rear view mirror for an automobile and a mirror for a bath room, the mirror may comprise a base made of a transparent material such as glass and synthetic resin; a transparent film; and a reflecting film formed on the rear surface of the base. In another configuration, a film may be transparent and a reflecting film may be formed between a base made of, e.g., glass or synthetic resin and the transparent film.

A composite according to this invention may be manufactured by a method wherein a film in the composite is formed by a plasma CVD technique, comprising the steps of placing a base in a vessel, generating plasma in reduced-pressure oxygen atmosphere in the vessel, and introducing a titanium-containing material in the region where excited species attributed to the plasma exist to deposit a film mainly comprising amorphous titanium oxide on a surface of the base. According to the method, a film mainly comprising amorphous titanium oxide may be deposited in a relatively-low temperature process, allowing use of a material with a low melting point such as synthetic resin as a base. Furthermore, even when using soda glass as a base, a film may be formed in a relatively-low temperature process so that diffusion of sodium in the soda glass into the film may be inhibited, resulting in elimination of the need for a passivation layer and achievement of a simplified manufacturing method. When a content of OH groups in a film is relatively large, a refractive index is reduced as compared with crystalline titanium dioxide, allowing reduction in surface reflection of the film. It may also reduce deterioration in visibility due to a double image which is cased when a mirror is fabricated using the composite of this invention.

In the manufacturing method according to this invention, the titanium-containing material may be, for example, one mainly comprising titanium alkoxide. Such a titanium alkoxide material may mainly comprise a material selected from the group consisting of titanium tetraisopropoxide $\{Ti(OC_3H_7)_4\}$, titanium tetraethoxide $\{Ti(OC_2H_5)_4\}$, and titanium tetrabutoxide $\{Ti(OC_4H_9)_4\}$. During deposition of the film on the base surface, the base may be, for example, at room temperature to 150° C. The film may be deposited while allowing ions in the plasma to collide with the base, to effectively decompose a stable monomer such as titanium alkoxide.

DETAILED DESCRIPTION OF THE PREFERRED EMBODIMENTS

Figure 1:
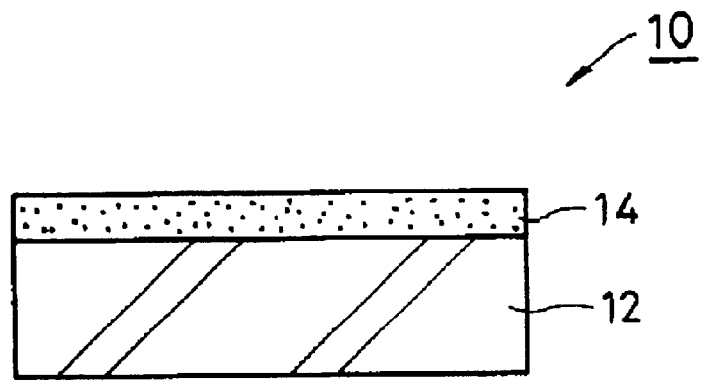
FIG. 1 is a longitudinal section illustrating an embodiment of a composite according to this invention.

An embodiment of this invention will be described below. FIG. 1 is a longitudinal section (the film is drawn with an enlarged thickness) illustrating an embodiment of a composite according to this invention. A composite 10 is composed of a base (substrate) 12 and a film 14 deposited on the base surface. The substrate 12 is a plate made of, for example, synthetic resin or glass. The film 14 is mainly composed of amorphous titanium oxide $\{TiO_x (x>2)\}$.

Figure 2:
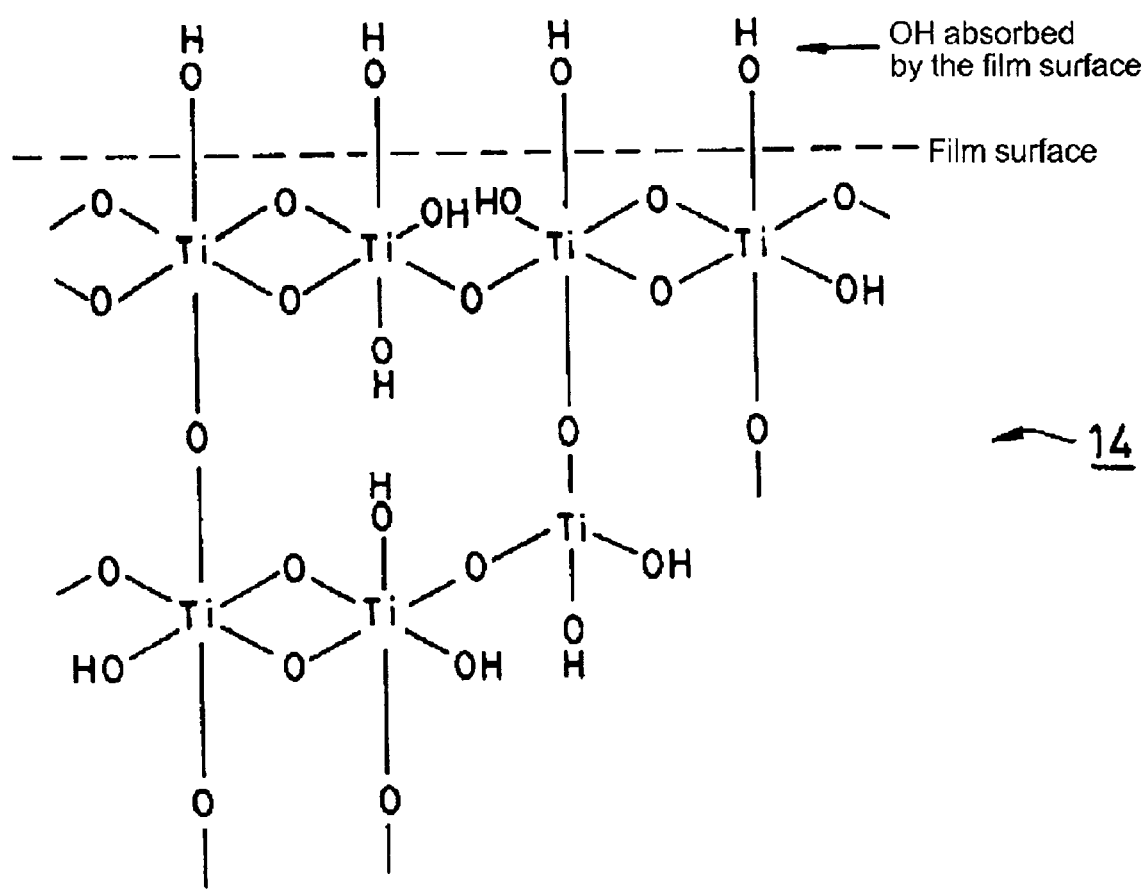
FIG. 2 schematically shows a network structure of the film 14 in FIG. 1.

FIG. 2 schematically shows the structure of the film 14. Titanium dioxide, either crystal or amorphous, has a basic structure where Ti is positioned at the center of an octahedron and an oxygen atom is positioned at each of six apices. The basic structures are mutually connected, sharing two edges for rutile and four edges for anatase. For the crystal type, the connection is regular in a wide range, while it is irregular for the amorphous type. In the film 14, connections between the basic structures of titanium oxide (based on titanium dioxide in FIG. 2) (a Ti—O—Ti bond network) are frequently cleaved, and Ti is bound to OH to form a terminal Ti—OH bond at many of the cleavage positions. Titanium dioxide is designated as $TiO_2$ because O is shared between the basic structures, while in the structure illustrated in FIG. 2, unshared oxygen atoms exist at the cleavage positions in the form of Ti—OH and thus $TiO_x$ is used to represent the whole composition (x>2; for example, x=2.3). A proportion of terminal Ti—OH bonds may be most suitably 5 to 30% of the whole Ti—O bonds in the connection between the basic structures.

Figure 3:
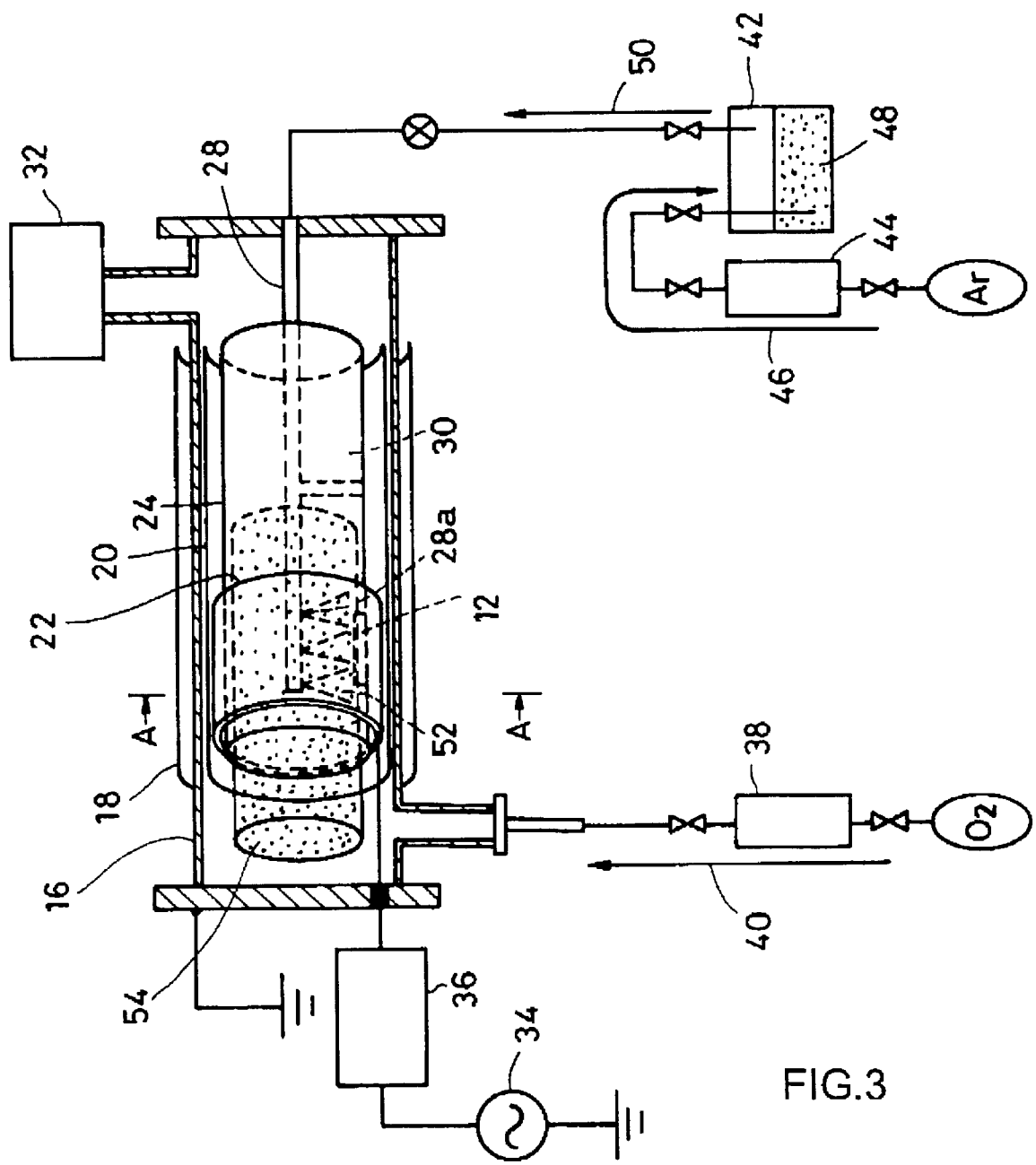
FIG. 3 schematically shows an exemplary configuration of a plasma CVD apparatus used for depositing the film 14 in FIG. 1.
Figure 4:
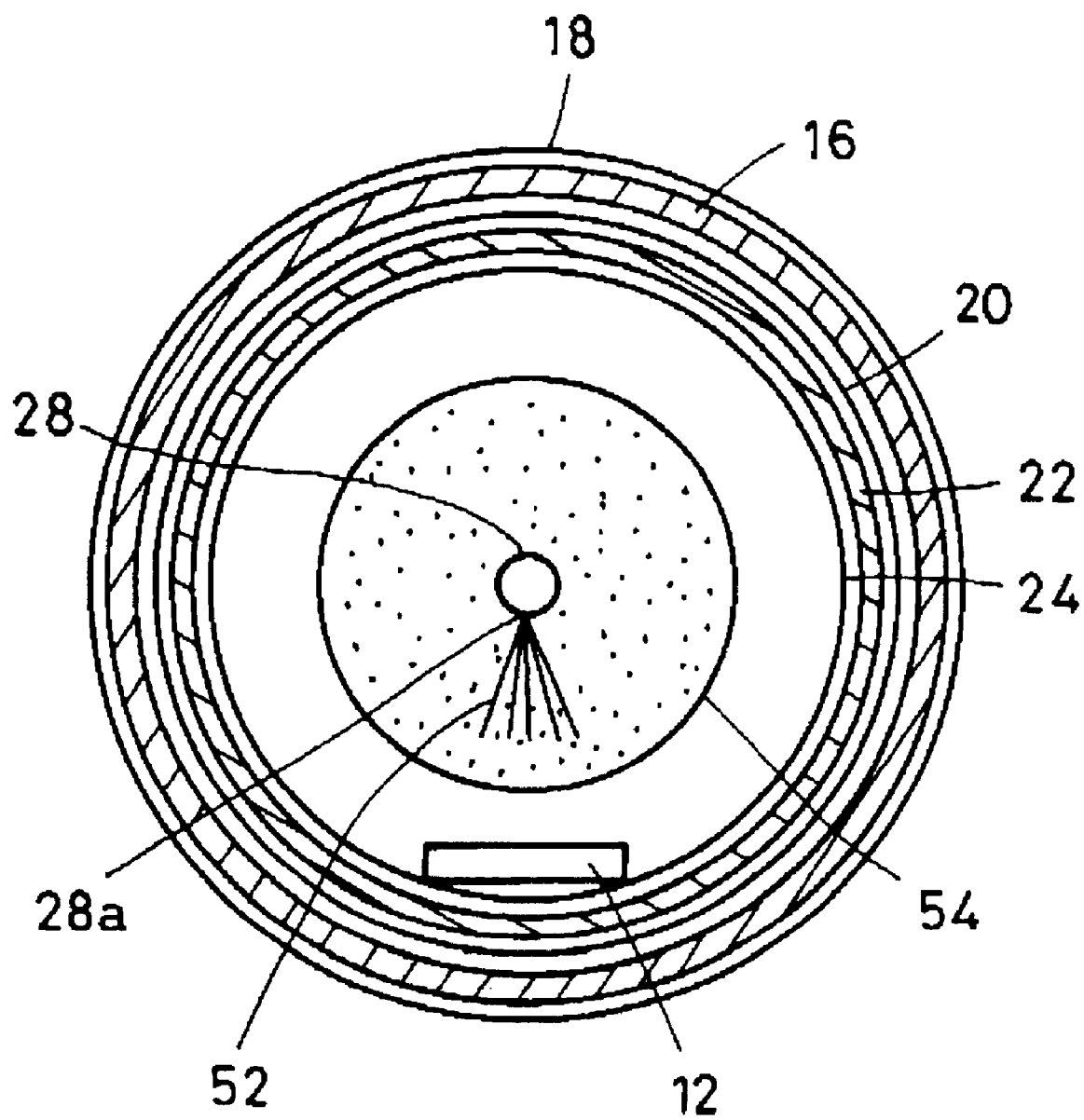
FIG. 4 is a section taken along a line A—A in FIG. 3.

A method for manufacturing the composite 10 in FIG. 1 will be described. FIG. 3 shows an exemplary configuration of a plasma CVD apparatus used for depositing the film 14. FIG. 4 is a section taken along line A—A in FIG. 3. A whole cylindrical vacuum vessel 16 is an anode. The outer surface of the vacuum vessel 16 is wrapped with a heater 18. In the vacuum vessel 16, a quartz tube 20, a cathode 22, and a quartz tube 24 are concentrically disposed in sequence. The outer quartz tube 20 is provided for ensuring insulation between the anode 16 and the cathode 22, while the inner quartz tube 24 is provided not only for preventing contamination of the anode 16 and the cathode 22 but also for supporting the substrate 12. On the central axis in the vacuum vessel 16, a material gas introducing pipe 28 is disposed in such a way that it is supported on the inner quartz tube 24 by a supporting post 30. The material gas introducing pipe 28 is electrically connected to the anode 16.

The vacuum vessel 16 is evacuated by a vacuum pump 32 such as a rotary pump. A radio-frequency generator 34 generates a radio-frequency voltage which is then applied between the cathode 22 and the anode 16 via a matching box 36. $O_2$ gas used as a plasma exciting gas is introduced into the vacuum vessel 16 through a plasma-exciting gas line 40 equipped with a mass flow controller (MFC) 38. Titanium tetraisopropoxide $\{Ti(OC_3H_7)_4\}$ used as a material monomer is heated in a bubbling cylinder 42. The heated material monomer is vaporized to give a vapor pressure depending on the heating temperature. The material gas vaporized by heating is fed to the material gas introducing pipe 28 through a material gas feeding line 50 by a difference between a vapor pressure of the material gas and a pressure in the vacuum vessel 16. A material gas 52 is showered toward the substrate 12 from material gas outlets 28a placed in a lower surface near the tip of the material gas introducing pipe 28. When the vapor pressure of the material gas is too low to obtain a desired flow rate of the material gas, a carrier gas may be used. The carrier gas may be preferably an inert gas such as Ar. The carrier gas is introduced into the material monomer 48 in the bubbling cylinder 42 through a carrier gas line 46 equipped with an MFC 44 and then into the vacuum vessel 16 while lifting the material gas up. Lifting up the material gas by the carrier gas allows a more amount of the material gas to be introduced into the vacuum vessel 16.

After reduced-pressure oxygen atmosphere to about 0.1 to 0.001 Torr is formed in the inside of the vacuum vessel 16, a radio-frequency voltage is applied between the cathode 22 and the anode 16 to induce electric discharge between the cathode 22 and the anode 16 and between the cathode 22 and the material gas introducing pipe 28 which is of the same potential as the anode 16. The discharge excites $O_2$ gas molecules introduced in the vacuum vessel 16 to generate plasma 54 and, at this time the material gas outlets 28a at the tip of the material gas introducing pipe 28 is located in the region of plasma 54, while the material gas 52 is showered from the material gas outlets 28a into the plasma 54. Thus, the material gas 52 is decomposed by oxygen radicals and ions constituting the plasma 54 to form precursors such as Ti—O, which are then deposited on the substrate 12. The deposited precursors are further activated under plasma atmosphere to form a Ti—O—Ti network. $Ti(OC_3H_7)_4$ contains hydrogen so that it can form Ti—OH in the process of formation of the precursors. The substrate 12 may be maintained at a low temperature of about room temperature to 150° C. (e.g., 70° C.) to inhibit dehydration and condensation reaction of Ti—OH so that the film 14 as illustrated in FIG. 2 is formed, in which Ti—OH remains in the Ti—O—Ti network. Some factors such as plasma density, pressure and a material feeding rate may be adjusted to control an amount (rate) of OH groups in the film 14. When the feeding rate of the material gas 52 is excessively high relative to the density of the plasma 54, hydrocarbon in the material monomer may be taken into the film 14 without being decomposed, leading to formation of the film 14 without adequate Ti—OH formation. On the other hand, when the feeding rate of the material gas 52 is excessively low relative to the density of the plasma 54, probability of collision between the excited species in the plasma 54 and the material gas molecules is increased, leading to excessive acceleration of Ti—O—Ti bond formation and thus to reduction in the amount of the remaining Ti—OH. It is, therefore, necessary to maintain an appropriate relationship between the feeding rate of the material gas 52 and density of the plasma 54

Figure 5:
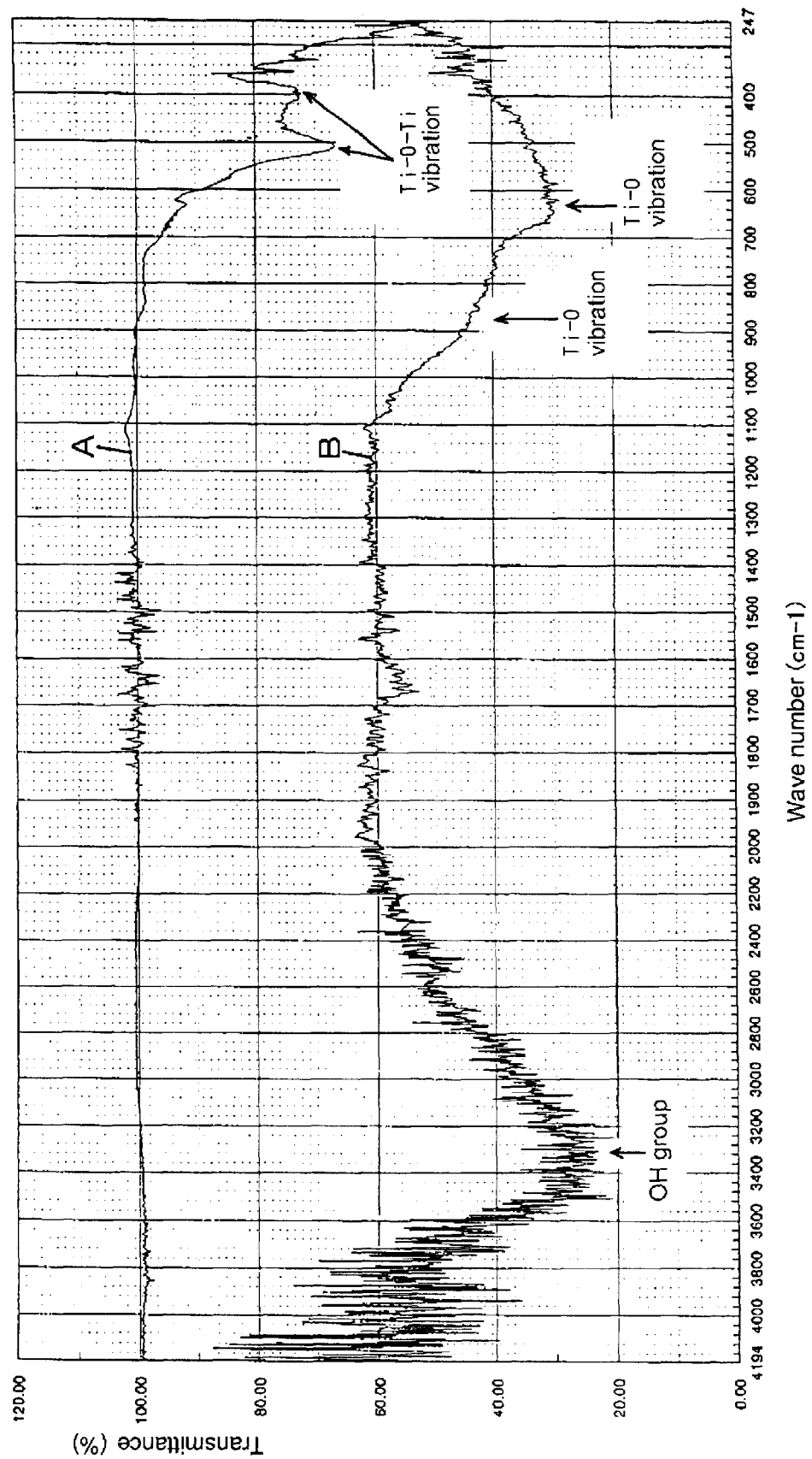
FIG. 5 shows the results of analysis of the film 14 according to this invention by FT-IR.

The results of analysis of the film 14 deposited by the above plasma CVD process will be described. FIG. 5 shows the results of analysis of the contained molecules by FT-IR (Fourier transform infrared spectrophotometer). Characteristic curve A is a spectrum for a crystal type titanium dioxide film deposited by sputtering, where sharp Ti—O—Ti vibration peaks are seen at 397 cm$^{-1}$ and 507 cm$^{-1}$ and no noticeable peaks corresponding to OH are present. Characteristic curve B is a spectrum for the film 14 according to this invention, where a large peak derived from OH is seen at about 3300 $cm^{-1}$, indicating that many OH groups are present in the film 14. Furthermore, broad peaks derived from a Ti—O bond are present near 650 $cm^{-1}$ and 850 $cm^{-1}$, indicating that the film 14 has a more distorted structure than that in the sputtered film. It is related to the fact that the Ti—O—Ti network is partially cleaved and the cleaved parts have OH terminals.

Figure 6:
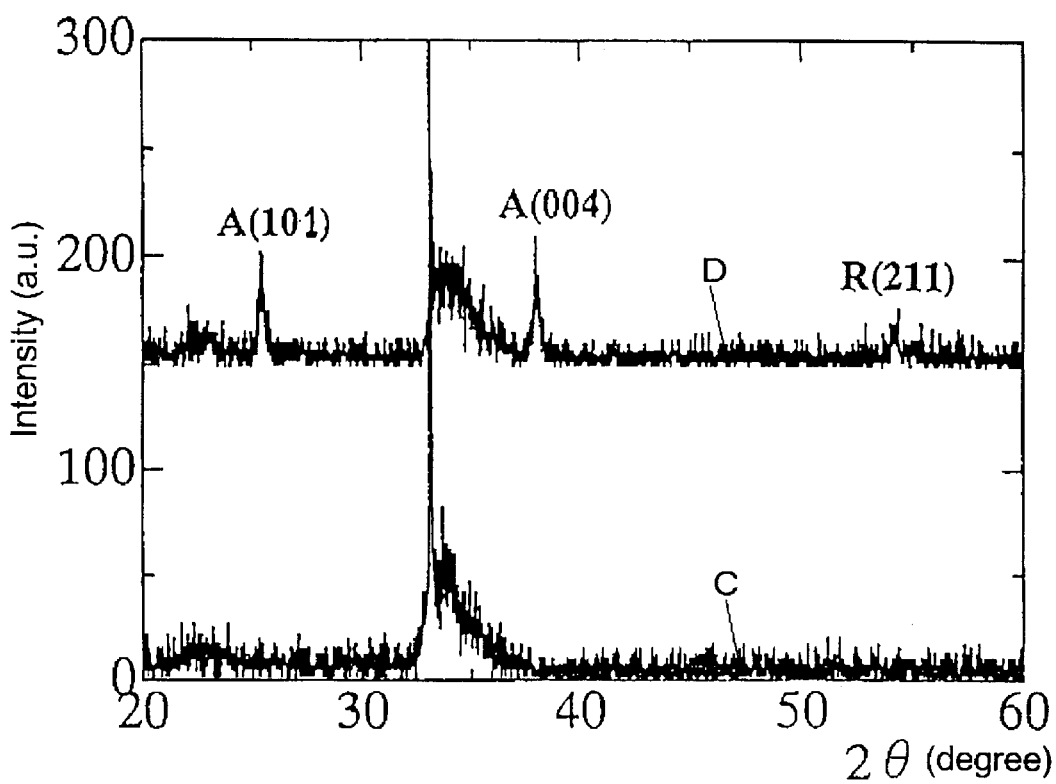
FIG. 6 shows the results of analysis of the film 14 according to this invention by XRD.
Figure 7:
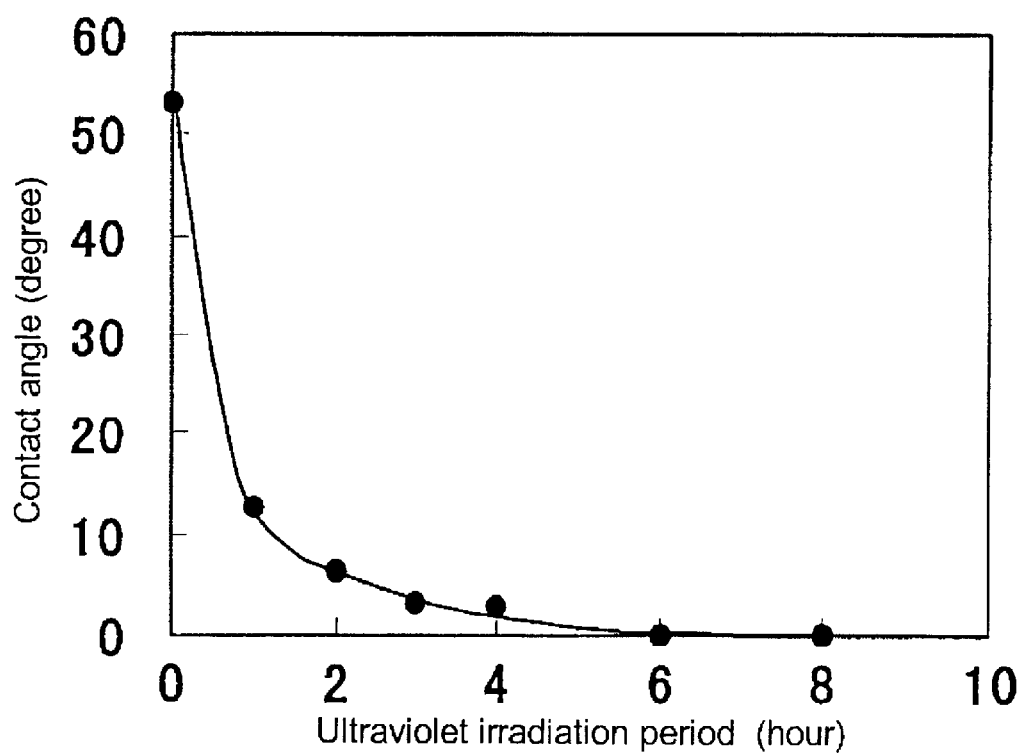
FIG. 7 shows hydrophilic property of the film 14 according to this invention.

FIG. 6 shows the results of analysis for crystallinity by XRD (X-ray diffractometer). Characteristic curve C is a spectrum for the film 14 according to this invention, where no noticeable peaks for crystalline titanium dioxide are seen. A broad peak near 33° is derived from a sample holder. Characteristic curve D is a spectrum after baking the sample exhibiting characteristic curve C at 800° C., indicating appearance of (101) and (004) peaks from anatase type and a (211) peak from rutile type. These results demonstrate that the film 14 according to this invention is amorphous. FIG. 7 shows hydrophilic property of the film 14 according to this invention. The hydrophilic property is better than that of the rutile type and comparable to that of the anatase type. The hydrophilicity-recovering property in FIG. 7 may indicate a photocatalyst effect, i.e., an effect of decomposing and removing hydrophobic materials absorbed on the surface of the film 14.

Figure 8:
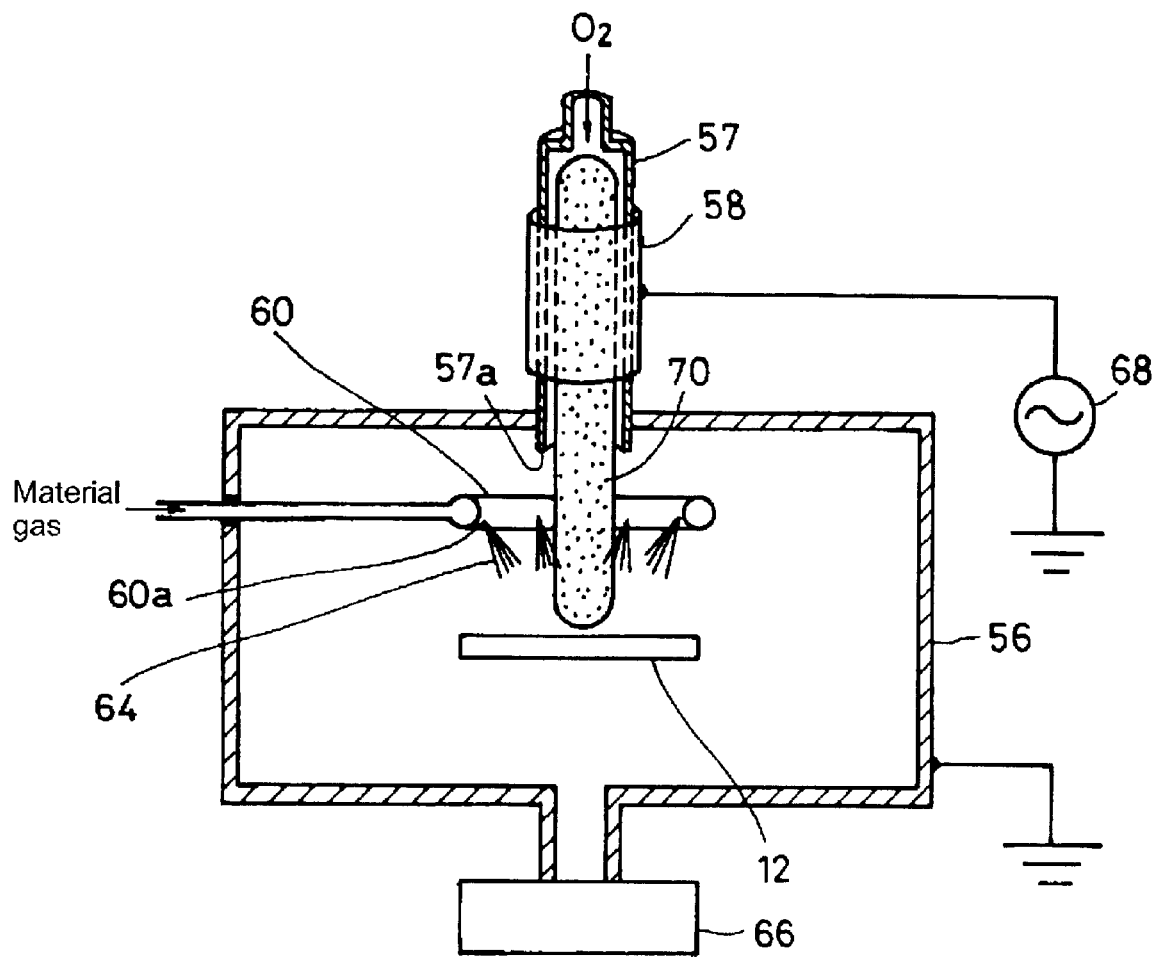
FIG. 8 schematically shows another example of a configuration for a plasma CVD apparatus used for depositing the film 14 in FIG. 1.

FIG. 8 shows another example of a configuration for a plasma CVD apparatus used for depositing the film 14 (a supporting mechanism for each part is not shown.). A whole vacuum vessel 56 constitutes an anode. From the top of the vacuum vessel 56, a quartz tube 57 is vertically inserted and the outer surface of the quartz tube 57 is wrapped with a cathode 58. Into the quartz tube 57, $O_2$ gas used as a plasma exciting gas is fed from an external source. The lower end 57a of the quartz tube 57 is opened in the vacuum vessel 56 and $O_2$ gas fed to the quartz 57 is showered into the vacuum vessel 56 from the lower end 57a. Below the lower end 57a of the quartz tube 57, a substrate 12 is horizontally disposed. An annular material gas introducing pipe 60 is horizontally disposed between the lower end 57a of the quartz tube 57 and the substrate 12. To the material introducing pipe 60, a material gas such as titanium tetraisopropoxide {Ti($OC_3H_7$)$_4$} or a mixture of the material gas and a carrier gas such as Ar is fed from an external source, and the material gas 64 is showered from a plurality of material gas outlets 60a separated with a circumferentially equal interval in a slightly inner area in the bottom surface of the pipe 60. The inside of the vacuum vessel 56 is evacuated by a vacuum pump 66 such as a rotary pump. A radio-frequency generator 68 generates a radio-frequency voltage, which is applied between the cathode 58 and the anode 56.

After forming an oxygen atmosphere to about 0.1 to 0001 Torr in the vacuum vessel 56, a radio-frequency voltage is applied between the cathode 58 and the anode 56 to induce electric discharge between the cathode 58 and the anode 56. The discharge excites $O_2$ gas molecules introduced in the vacuum vessel 56 to generate plasma 70, which passes through the ring center of the material gas introducing pipe 60. The material gas 64 is showered from material gas outlets 60a of the material gas introducing pipe 60 toward a diagonally lower part of the ring inside (i.e., toward the plasma 70 and the substrate 12). Thus, the material gas 64 is decomposed by oxygen radicals and ions constituting the plasma 70 to form precursors such as Ti—O, which are then deposited on the substrate 12. The deposited precursors are further activated under the plasma atmosphere to form a Ti—O—Ti network. Ti($OC_3H_7$)$_4$ contains hydrogen so that it can form Ti—OH in the process of formation of the precursors. The substrate 12 may be maintained at a low temperature of about room temperature to 150° C. (e.g., 70° C.) to inhibit dehydration and condensation reaction of Ti—OH so that the film 14 as illustrated in FIG. 2 is formed, in which Ti—OH remains in the Ti—O—Ti network. Some factors such as plasma density, pressure and a material feeding rate may be adjusted to form the film 14 in which an appropriate amount of Ti—OH remains. Using the plasma CVD apparatus as illustrated in FIG. 8, enhanced oxygen gas is showered toward the substrate 12 so that not only radicals but also ions in the plasma 70 may collide with the substrate 12 to effectively decompose a stable monomer such as Ti($OC_3H_7$)$_4$.

Figure 9:
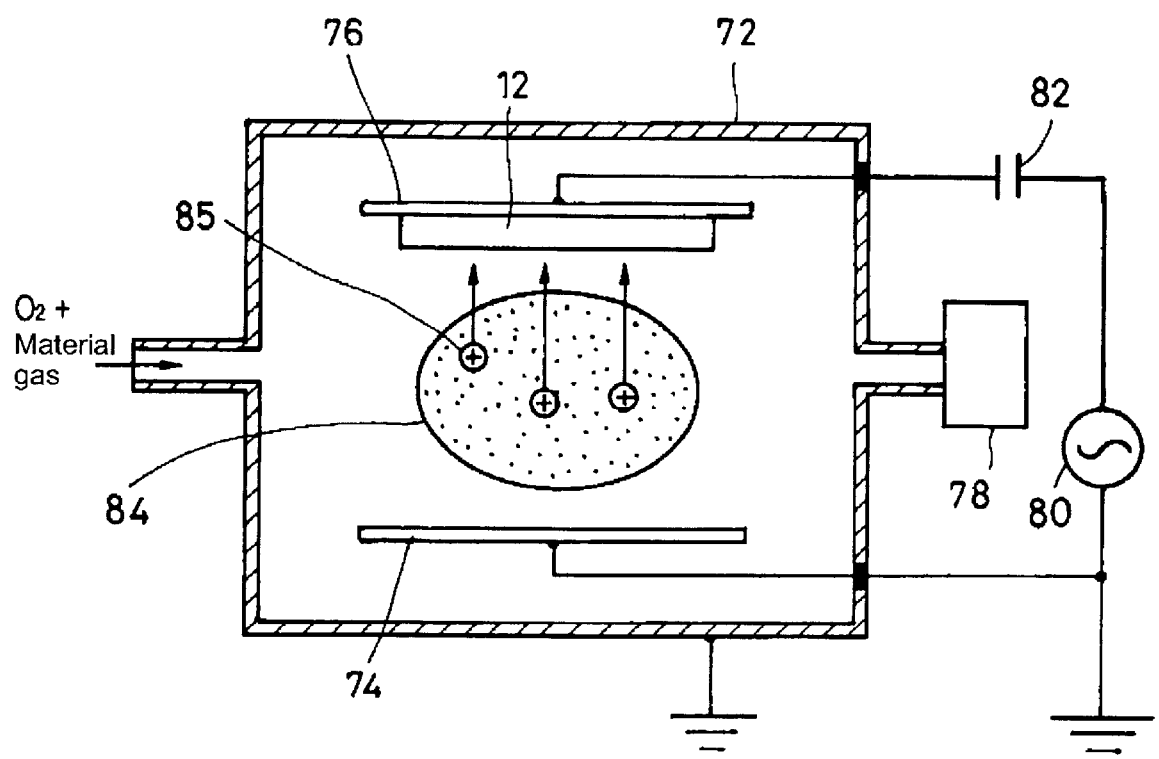
FIG. 9 schematically shows a further example of a configuration for a plasma CVD apparatus used for depositing the film 14 in FIG. 1.

FIG. 9 shows a further example of a configuration for a plasma CVD apparatus used for depositing the film 14 (a supporting mechanism for each part is not shown). In a vacuum vessel 72, an anode 74 and a cathode 76 are positioned facing each other. On a surface of the cathode 76 facing the anode 74, a substrate 12 is held. Into the vacuum vessel 72, a mixture of $O_2$ gas used as a plasma exciting gas and a material gas such as titanium tetraisopropoxide {Ti($OC_3H_7$)$_4$} are supplied from external sources. The vacuum vessel 72 is evacuated by a vacuum pump 78 such as a rotary pump. A radio-frequency generator 80 generates a radio-frequency voltage, which is applied between the cathode 76 and the anode 74. There is inserted a capacitor 82 between the radio-frequency generator 80 and the cathode 76.

After forming an oxygen atmosphere to about 0.1 to 0.001 Torr in the vacuum vessel 72, a radio-frequency voltage is applied between the cathode 76 and the anode 74 to induce electric discharge between the cathode 76 and the anode 74. The discharge excites $O_2$ gas molecules to generate plasma 84. The material gas is decomposed by oxygen radicals and ions constituting the plasma 84 to form precursors such as Ti—O, which are then deposited on the substrate 12. The deposited precursors are further activated under the plasma atmosphere to form a Ti—O—Ti network. Ti($OC_3H_7$)$_4$ contains hydrogen so that it can form Ti—OH in the process of formation of the precursors. The substrate 12 may be maintained at a low temperature of about room temperature to 150° C. (e.g., 70° C.) to inhibit dehydration and condensation reaction of Ti—OH so that the film 14 as illustrated in FIG. 2 is formed, in which Ti—OH remains in the Ti—O—Ti network. Some factors such as plasma density, pressure and a material feeding rate may be adjusted to form the film 14 in which an appropriate amount of Ti—OH remains. Using the plasma CVD apparatus as illustrated in FIG. 9, a negative self-bias voltage is applied to the cathode 76 by the action of the capacitor 82 inserted on the side of the cathode 76. Thus, oxygen cations 85 in the plasma 84 may collide with the substrate 12 to effectively decompose a stable monomer such as Ti($OC_3H_7$)$_4$.

Figure 10:
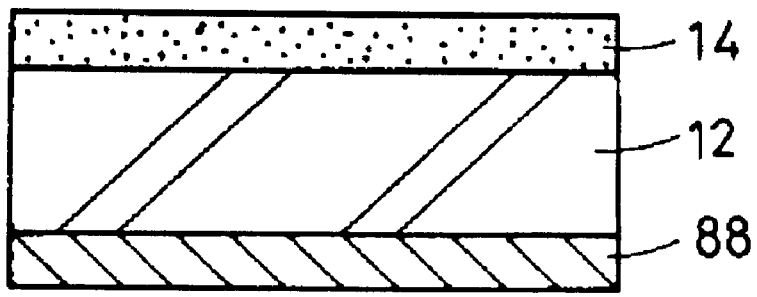
FIG. 10 is a longitudinal section showing an embodiment where a composite according to this invention is used as an anti-fog mirror (rear surface mirror)
Figure 11:
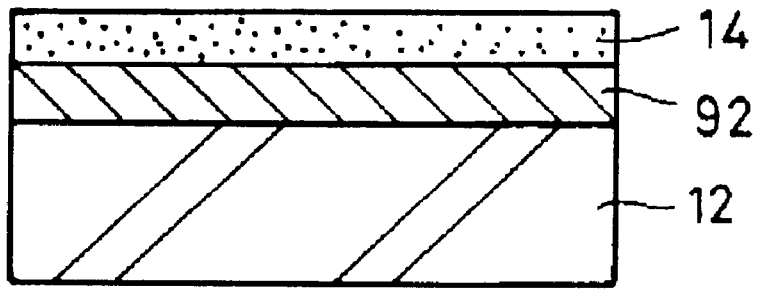
FIG. 11 is a longitudinal section showing an embodiment where a composite according to this invention is used as an anti-fog mirror (front surface mirror).

FIGS. 10 and 11 show an embodiment where a composite according to this invention is used as an anti-fog mirror such as an automobile exterior rear view mirror and a bath mirror. An anti-fog mirror 86 in FIG. 10 is constructed as a rear surface mirror, where a reflection film 88 made of, for example, Cr or Al is deposited on the rear surface of the substrate 12 in the composite 10 in FIG. 1. The reflecting film 88 may be deposited before or after deposition of the film 14. An anti-fog mirror 90 in FIG. 11 is constructed as a front surface mirror, where a reflecting film 92 is disposed between the substrate 12 and the film 14 in the composite 10 in FIG. 1. The reflecting film 88 may be deposited before deposition of the film 14.

These embodiments have been described as using titanium tetraisopropoxide {Ti($OC_3H_7$)$_4$} as a starting material, but other titanium alkoxides such as titanium tetraethoxide {Ti(OC$_2$H$_5$)$_4$} and titanium tetrabutoxide {Ti(OC$_4$H$_9$)$_4$} may be also used as a starting material. In these embodiments, a film 14 is deposited directly on a substrate 12 or a reflecting film 92, but in this invention, another functional film may be separately formed between the substrate 12 or the reflecting film 92 and the film 14. A film 14 is formed as the top surface in these embodiments, but, in this invention, another functional film may be formed on the film 14 as long as adequate hydrophilicity required in this invention is provided. These embodiments have a configuration that in the film 14, connections between the basic structures of the titanium oxide (a Ti—O—Ti bond network) are frequently cleaved and in many of the cleavage positions Ti is bound to OH to form a terminal Ti—OH bond, but in this invention, there may exist a moiety where at a cleavage position Ti is bound to an atom or group other than OH as long as adequate hydrophilicity required in this invention is provided. The film in this invention may contain substances other than amorphous titanium oxide as long as adequate hydrophilicity required in this invention is provided.

What is claimed is:

1. A method for manufacturing a composite comprising a base and a film mainly formed of amorphous titanium oxide on the base, wherein the amorphous titanium oxide partially has a structure in the film in which a network of Ti—O—Ti bonds are broken to give terminal Ti—OH bonds, said method comprising the steps of placing a base in a vessel, generating plasma in reduced-pressure oxygen atmosphere in said vessel, and introducing a titanium-containing material in the region where excited species attributed to the plasma exist to deposit a film mainly comprising amorphous titanium oxide on a surface of said base.

2. The method for manufacturing the composite according to claim 1, wherein said titanium-containing material mainly comprises titanium alkoxide.

3. The method for manufacturing the composite according to claim 2, wherein said titanium alkoxide mainly comprises a material selected from the group consisting of titanium tetraisopropoxide (Ti(OC$_3$H$_7$)$_4$), titanium tetraethoxide (Ti(OC$_2$H$_5$)$_4$), and titanium tetrabutoxide (Ti(OC$_4$H$_9$)$_4$).

4. The method for manufacturing the composite according to claim 1, wherein during deposition of said film on said base surface, the base is at room temperature to 150° C.

5. The method for manufacturing the composite according to claim 1, wherein said film is deposited while ions in said plasma are colliding with said base.

* * * * *